(12) United States Patent
Saito et al.

(10) Patent No.: US 10,784,361 B2
(45) Date of Patent: Sep. 22, 2020

(54) SEMICONDUCTOR DEVICE AND METHOD FOR MANUFACTURING THE SAME

(71) Applicant: Kabushiki Kaisha Toshiba, Minato-ku (JP)

(72) Inventors: Hisashi Saito, Kawasaki (JP); Miki Yumoto, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/993,133

(22) Filed: Jan. 12, 2016

(65) Prior Publication Data
US 2016/0225886 A1    Aug. 4, 2016

(30) Foreign Application Priority Data

Feb. 4, 2015    (JP) .................................. 2015-020708

(51) Int. Cl.
*H01L 29/66*    (2006.01)
*H01L 29/51*    (2006.01)
(Continued)

(52) U.S. Cl.
CPC ...... *H01L 29/513* (2013.01); *H01L 29/66462* (2013.01); *H01L 29/7786* (2013.01); *H01L 29/1066* (2013.01); *H01L 29/2003* (2013.01)

(58) Field of Classification Search
CPC ............. H01L 29/66462; H01L 29/778; H01L 29/7787; H01L 29/66431; H01L 29/2003; H01L 2924/13064; H01L 23/3171
See application file for complete search history.

(56) References Cited

U.S. PATENT DOCUMENTS

| 2007/0051979 A1* | 3/2007 | Kambayashi | ....... H01L 23/3171 |
| | | | 257/194 |
| 2007/0164321 A1* | 7/2007 | Sheppard | .......... H01L 29/66462 |
| | | | 257/256 |

(Continued)

FOREIGN PATENT DOCUMENTS

JP    2007-173426    7/2007
JP    2007-250950 A    9/2007
(Continued)

OTHER PUBLICATIONS

Narihiko Maeda et al. "RF and DC Characteristics in Al$_2$O$_3$/Si$_3$N$_4$ Insulated-Gate AlGaN/GaN Heterostructure Field-Effect Transistors with Regrown Ohmic Structure", Phys. Stat. Sol. (A), vol. 203, No. 7, 2006, 5 pages.

(Continued)

*Primary Examiner* — Monica D Harrison
*Assistant Examiner* — John Lin
(74) *Attorney, Agent, or Firm* — Oblon, McClelland, Maier & Neustadt, L.L.P.

(57) ABSTRACT

A semiconductor device according to an embodiment includes a first GaN-based semiconductor layer, a second GaN-based semiconductor layer provided on the first GaN-based semiconductor layer and having a wider band gap than the first GaN-based semiconductor layer, a source electrode electrically connected to the second GaN-based semiconductor layer, a drain electrode electrically connected to the second GaN-based semiconductor layer, a gate electrode provided between the source electrode and the drain electrode, and a passivation film provided on the second GaN-based semiconductor layer between the source electrode and the gate electrode and between the gate electrode and the drain electrode, the passivation film including a first insulating film and a second insulating film, the first insulating film including nitrogen, the first insulating film having a (Continued)

thickness equal to or greater than 0.2 nm and less than 2 nm, the second insulating film including oxygen and provided on the first insulating film.

5 Claims, 6 Drawing Sheets

(51) Int. Cl.
    *H01L 29/778*     (2006.01)
    *H01L 29/20*     (2006.01)
    *H01L 29/10*     (2006.01)

(56) References Cited

U.S. PATENT DOCUMENTS

| | | | |
|---|---|---|---|
| 2009/0072272 A1* | 3/2009 | Suh | H01L 29/1066 257/194 |
| 2010/0155780 A1* | 6/2010 | Machida | H01L 29/1066 257/192 |
| 2011/0297958 A1* | 12/2011 | Kub | H01L 29/1602 257/76 |
| 2012/0161153 A1 | 6/2012 | Yumoto et al. | |
| 2013/0075751 A1 | 3/2013 | Imanishi | |
| 2013/0260517 A1 | 10/2013 | Komatani | |
| 2014/0353673 A1 | 12/2014 | Ito et al. | |
| 2014/0367699 A1 | 12/2014 | Teramoto et al. | |

FOREIGN PATENT DOCUMENTS

| | | |
|---|---|---|
| JP | 2008-112750 | 5/2008 |
| JP | 2008-277640 | 11/2008 |
| JP | 2012-124436 A | 6/2012 |
| JP | 2012-156245 | 8/2012 |
| JP | 2013-012735 A | 1/2013 |
| JP | 2013-065612 A | 4/2013 |
| JP | 2013-074179 A | 4/2013 |
| JP | 2013-211461 A | 10/2013 |
| JP | 2014-229879 A | 12/2014 |
| JP | 2014-236011 A | 12/2014 |
| WO | WO 2011/039800 A1 | 4/2011 |

OTHER PUBLICATIONS

Narihiko Maeda et al. "Systematic Study of Insulator Deposition Effect ($Si_3N_4$, $SiO_2$, AlN and $Al_2O_3$) on Electrical Properties in AlGaN/GaN Heterostructures", Japanese Journal of Applied Physics, vol. 46, No. 2, 2007, 9 pages.

* cited by examiner

US 10,784,361 B2

1

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2015-020708, filed on Feb. 4, 2015, the entire contents of which are incorporated herein by reference.

FIELD

Embodiments described herein relate generally to a semiconductor device and a method for manufacturing the same.

BACKGROUND

Semiconductor devices, such as switching devices or diodes, are used in circuits, such as switching power supplies or inverters. The semiconductor devices require a high breakdown voltage and low on resistance. A trade-off relationship which is determined by a semiconductor material is established between the breakdown voltage and the on resistance.

With the progress of technical development, the on resistance of the semiconductor device has been reduced to a value close to the lower limit of the on resistance of silicon which is a representative semiconductor material. It is necessary to change the semiconductor material in order to further increase the breakdown voltage or to further reduce the on resistance. A GaN-based semiconductor, such as GaN or AlGaN, or a wide bandgap semiconductor, such as silicon carbide (SiC), is used as the semiconductor material of the switching device to improve the trade-off relationship determined by the semiconductor material and to achieve a high breakdown voltage or low on resistance.

A high electron mobility transistor (HEMT) using an AlGaN/GaN heterostructure is given as an example of the semiconductor device which uses the GaN-based semiconductor and has low on resistance. The on resistance of the HEMT is reduced by high mobility of a hetero interface channel and high electron concentration caused by polarization. Therefore, low on resistance is obtained even though the chip area of the device is small.

However, in the HEMT using the GaN-based semiconductor, there is a concern that current collapse or a variation in characteristics, such as a threshold voltage variation, will occur due to the trapping of charge to an insulating film provided on the GaN-based semiconductor.

2

Figure 5:
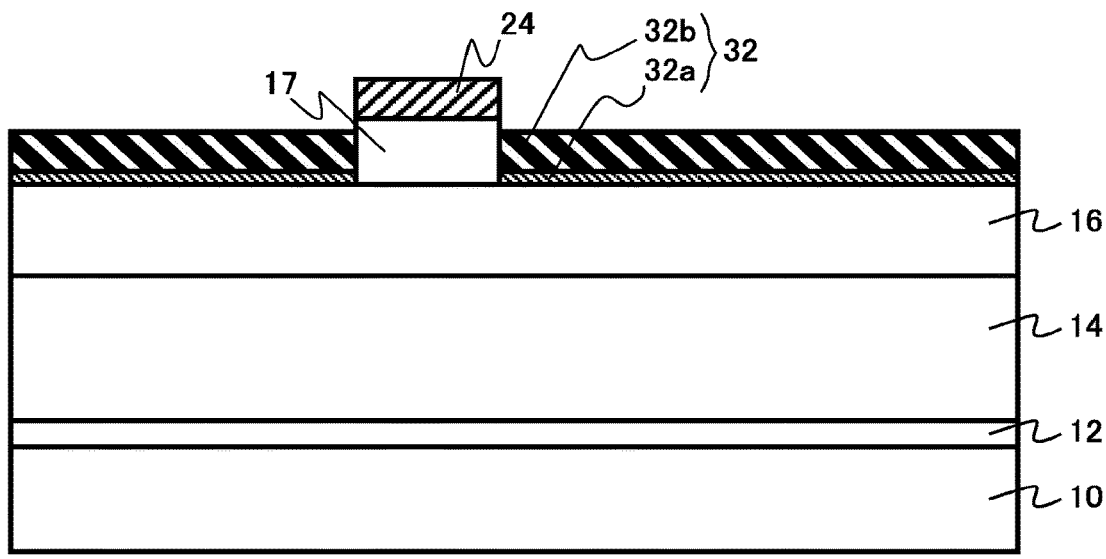

FIG. 5 is a cross-sectional view schematically illustrating the semiconductor device which is being manufactured in the method for manufacturing the semiconductor device according to the first embodiment.

Figure 6:
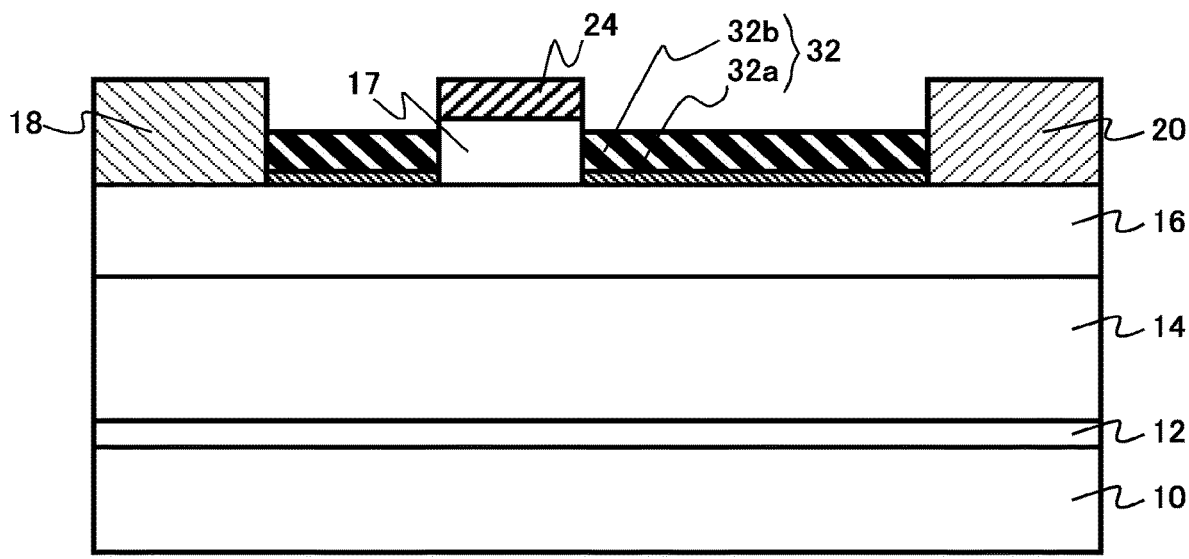

FIG. 6 is a cross-sectional view schematically illustrating the semiconductor device which is being manufactured in the method for manufacturing the semiconductor device according to the first embodiment.

Figure 7:
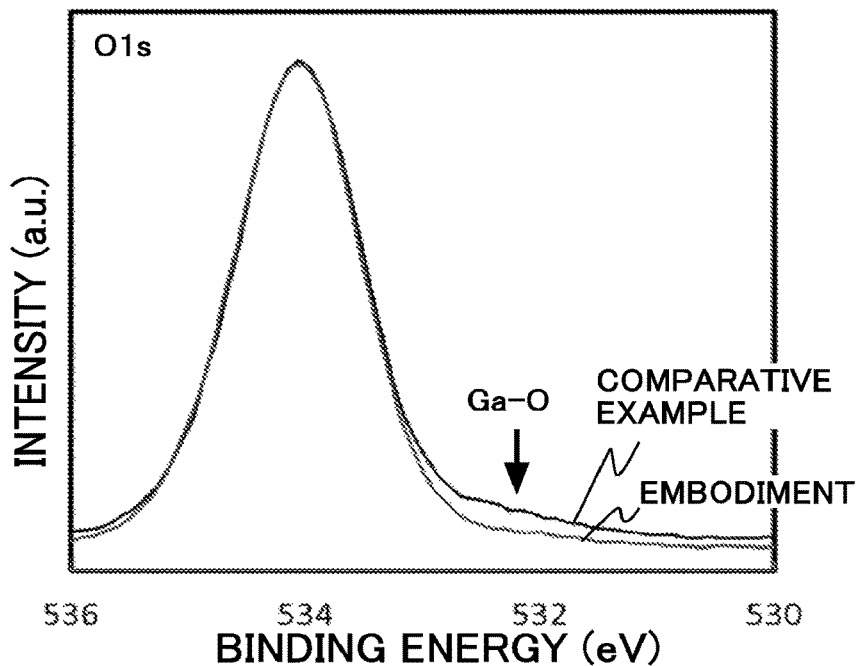

FIG. 7 is a diagram illustrating the function of the semiconductor device according to the first embodiment.

Figure 8:
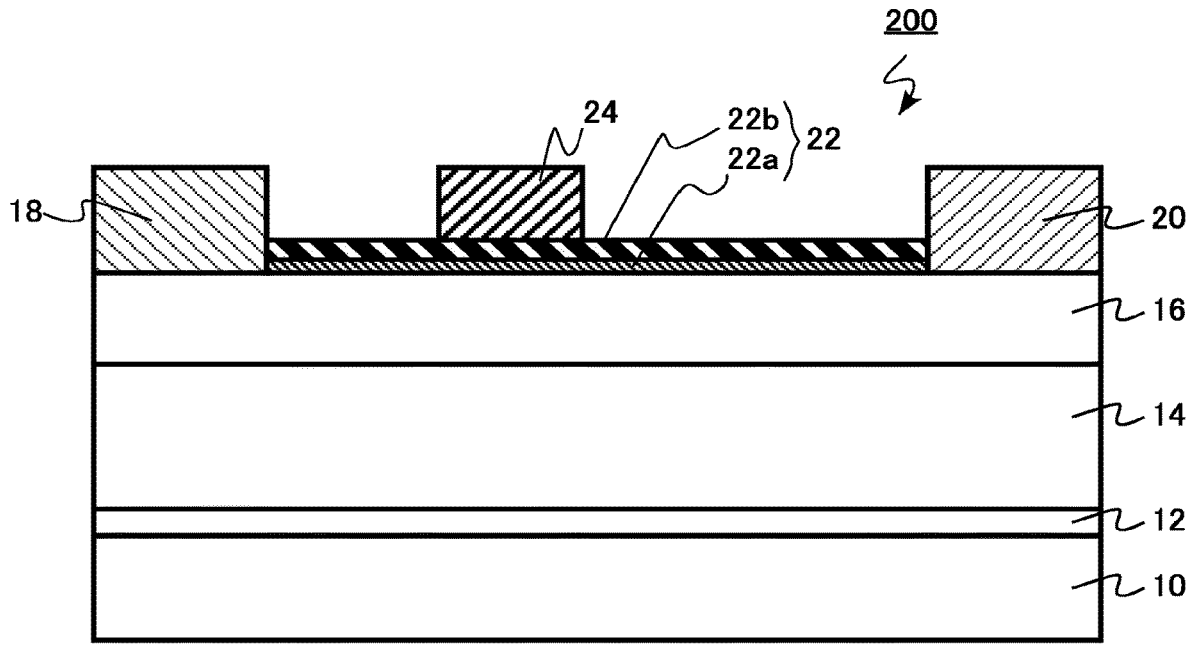

FIG. 8 is a cross-sectional view schematically illustrating a semiconductor device according to a second embodiment.

Figure 9:
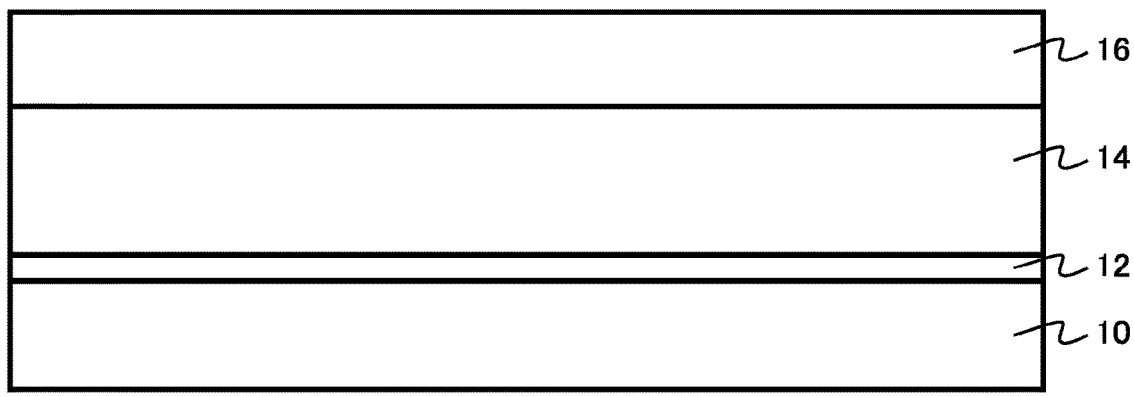

FIG. 9 is a cross-sectional view schematically illustrating the semiconductor device according to the second embodiment.

Figure 10:
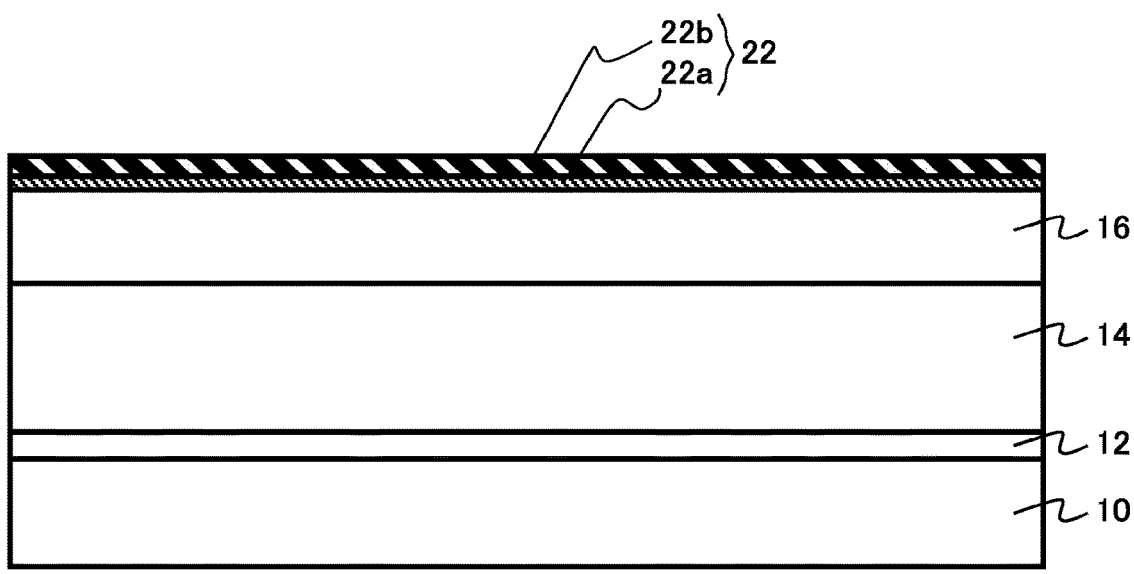

FIG. 10 is a cross-sectional view schematically illustrating the semiconductor device according to the second embodiment.

Figure 11:
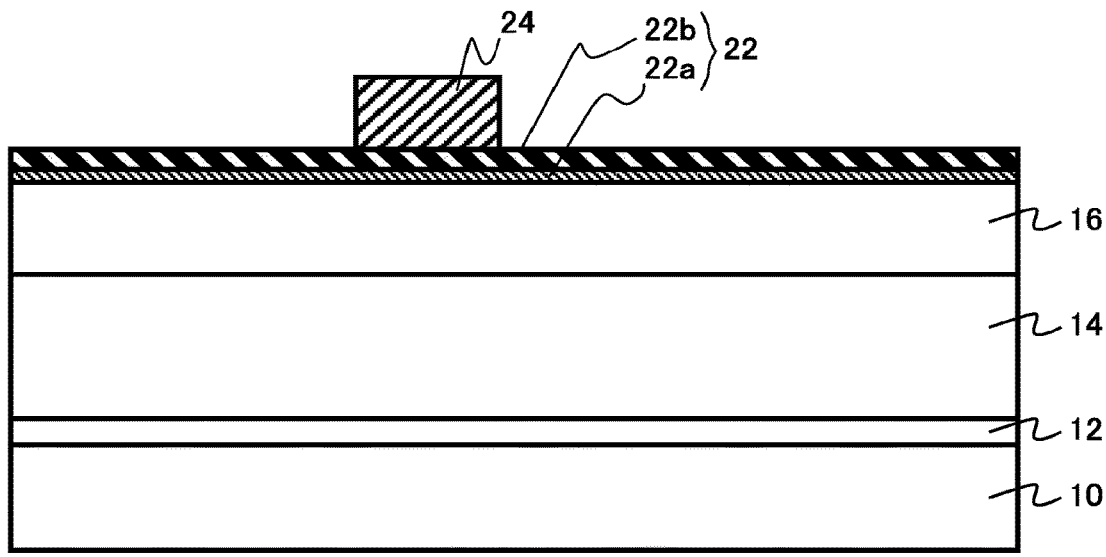

FIG. 11 is a cross-sectional view schematically illustrating the semiconductor device according to the second embodiment.

Figure 12:
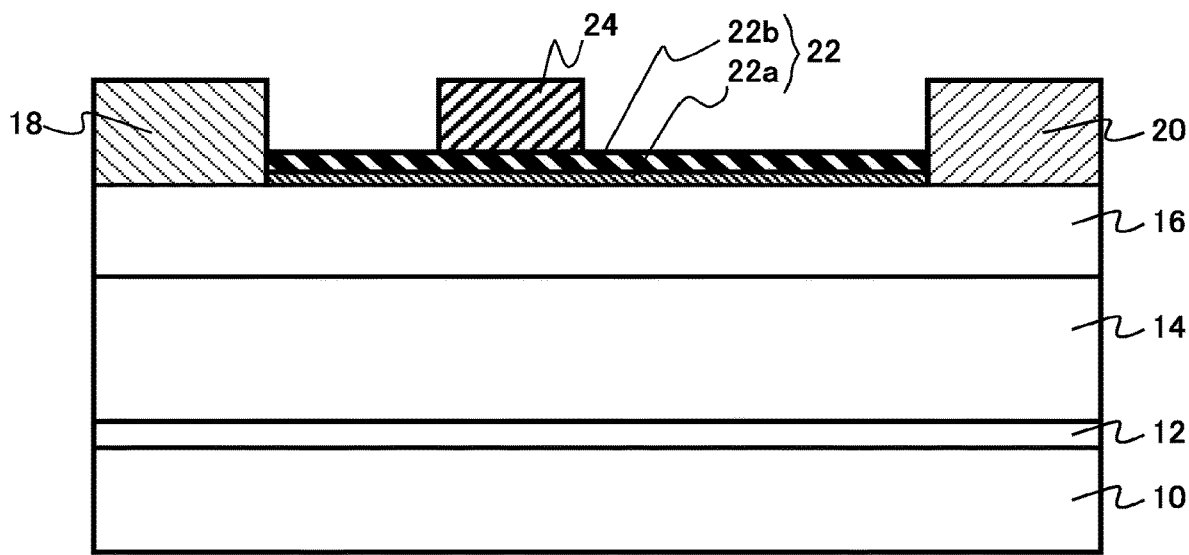

FIG. 12 is a cross-sectional view schematically illustrating the semiconductor device according to the second embodiment.

DETAILED DESCRIPTION

A semiconductor device according to an aspect of the invention includes a first GaN-based semiconductor layer, a second GaN-based semiconductor layer provided on the first GaN-based semiconductor layer and having a wider band gap than the first GaN-based semiconductor layer, a source electrode electrically connected to the second GaN-based semiconductor layer, a drain electrode electrically connected to the second GaN-based semiconductor layer, a gate electrode provided between the source electrode and the drain electrode, and a passivation film including a first insulating film that includes nitrogen, is provided on the second GaN-based semiconductor layer between the source electrode and the gate electrode and between the gate electrode and the drain electrode, and has a thickness equal to or greater than 0.2 nm and less than 2 nm and a second insulating film that includes oxygen and is provided on the first insulating film.

In the specification, in some cases, the same or equivalent members are denoted by the same reference numerals and the description thereof will not be repeated.

In the specification, a "GaN-based semiconductor" is a generic term for semiconductors having a gallium nitride (GaN), an aluminum nitride (AlN), an indium nitride (InN), and intermediate compositions thereof.

In the specification, "undope" means that impurity concentration is equal to or less than $1\times10^{16}$ cm$^{-3}$.

In the specification, for example, in order to indicate the positional relationship between components, the upward direction of the drawings is described as an "upper side" and the downward direction of the drawings is described as a "lower side". In the specification, the concept of the "upper" and "lower" sides does not necessarily indicate the relationship with the direction of gravity.

First Embodiment

A semiconductor device according to this embodiment includes a first GaN-based semiconductor layer, a second GaN-based semiconductor layer provided on the first GaN-based semiconductor layer and having a wider band gap than the first GaN-based semiconductor layer, a source electrode electrically connected to the second GaN-based semiconductor layer, a drain electrode electrically connected to the second GaN-based semiconductor layer, a gate electrode provided between the source electrode and the drain electrode, and a passivation film provided on the second GaN-based semiconductor layer between the source electrode and the gate electrode and between the gate electrode and the drain electrode, the passivation film including a first insulating film and a second insulating film, the first insulating film including nitrogen, the first insulating film having a thickness equal to or greater than 0.2 nm and less than 2 nm, the second insulating film including oxygen, the second insulating film provided on the first insulating film.

Figure 1:
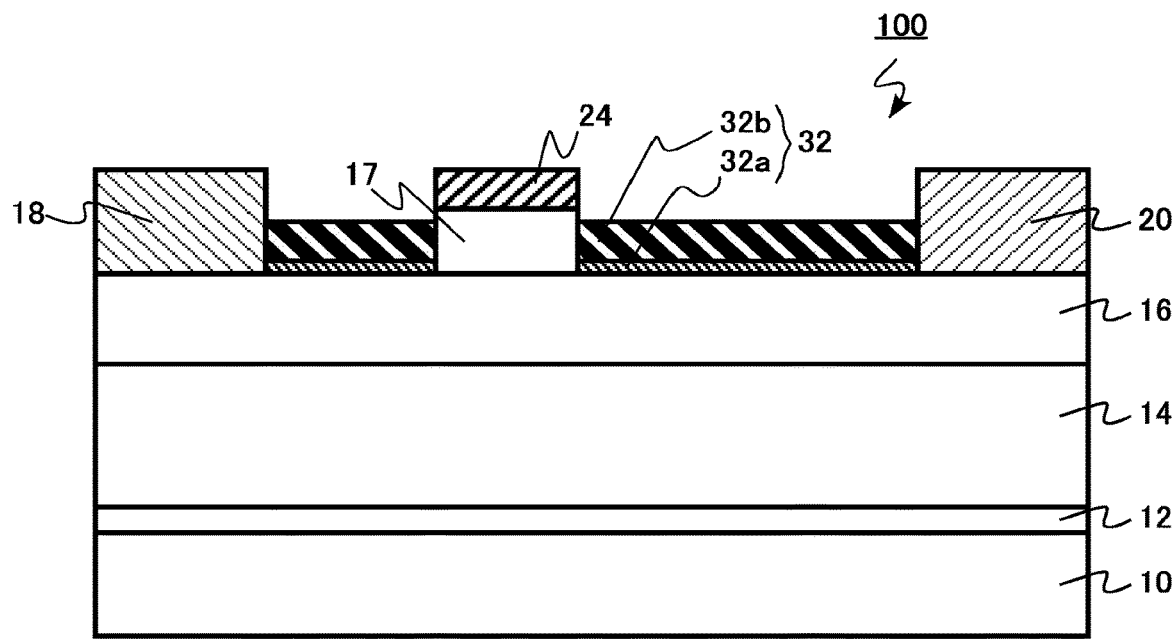
FIG. 1 is a cross-sectional view schematically illustrating a semiconductor device according to a first embodiment.

FIG. 1 is a cross-sectional view schematically illustrating a semiconductor device according to this embodiment. The semiconductor device according to the embodiment is a high electron mobility transistor (HEMT) using a GaN-based semiconductor.

As shown in FIG. 1, a semiconductor device (HEMT) 100 includes a substrate 10, a buffer layer 12, a channel layer (first GaN-based semiconductor layer) 14, a barrier layer (second GaN-based semiconductor layer) 16, a cap layer (third GaN-based semiconductor layer) 17, a source electrode 18, a drain electrode 20, a gate electrode 24, and a passivation film 32.

The substrate 10 is made of, for example, silicon (Si). For example, sapphire ($Al_2O_3$) or silicon carbide (SiC) can be applied, in addition to silicon.

The buffer layer 12 is provided on the substrate 10. The buffer layer 12 has a function of reducing the lattice mismatch between the substrate 10 and the channel layer 14. The buffer layer 12 has, for example, a multi-layer structure of aluminum gallium nitride ($Al_WGa_{1-W}N$ (0<W<1)).

The channel layer 14 is provided on the buffer layer 12. The channel layer 14 is made of, for example, undoped $Al_XGa_{1-X}N$ (0≤X<1). Specifically, for example, the channel layer 14 is made of undoped GaN. The thickness of the channel layer 14 is, for example, equal to or greater than 0.5 μm and equal to or less than 3 μm.

The barrier layer 16 is provided on the channel layer 14. The band gap of the barrier layer 16 is wider than the band gap of the channel layer 14. The barrier layer 16 is made of, for example, undoped $Al_YGa_{1-Y}N$ (0<Y≤1, X<Y). More specifically, the barrier layer 16 is made of, for example, undoped $Al_{0.25}Ga_{0.75}N$. For example, the thickness of the barrier layer 16 is equal to or greater than 15 nm and equal to or less than 50 nm.

A heterojunction interface is provided between the channel layer 14 and the barrier layer 16. When the semiconductor device 100 is turned on, a two-dimensional electron gas (2DEG) is formed at the heterojunction interface and functions as a carrier.

The source electrode 18 and the drain electrode 20 are formed on the barrier layer 16. The source electrode 18 and the drain electrode 20 are, for example, metal electrodes. The metal electrode has, for example, a stacked structure of titanium (Ti) and aluminum (Al). It is preferable that the source electrode 18 and the drain electrode 20 come into ohmic contact with the barrier layer 16. The distance between the source electrode 18 and the drain electrode 20 is, for example, equal to or greater than 5 μm and equal to or less than 30 μm.

The p-type cap layer 17 is provided between the source electrode 18 and the drain electrode 20 on the barrier layer 16. The cap layer 17 has a function of raising the potential of the channel layer 14 to increase the threshold voltage of the HEMT 100. For example, the composition, thickness, and p-type impurity concentration of the p-type cap layer 17 can be appropriately set to achieve a normally-off HEMT.

The cap layer 17 is made of, for example, p-type $Al_UGa_{1-U}N$ (0≤U<1). Specifically, for example, the cap layer 17 is made of p-type GaN. The thickness of the cap layer 17 is, for example, equal to or greater than 50 nm and equal to or less than 200 nm.

The cap layer 17 includes p-type impurities such as magnesium (Mg). The atomic concentration of the p-type impurities in the cap layer 17 is preferably equal to or greater than $1 \times 10^{17}$ $cm^{-3}$ and more preferably equal to or greater than $1 \times 10^{18}$ $cm^{-3}$ in order to raise the potential of the channel layer 14. The cap layer 17 is a single crystal layer.

The gate electrode 24 is provided on the cap layer 17. The gate electrode 24 is, for example, a metal electrode. The metal electrode is made of, for example, titanium nitride (TiN) or tungsten (W). It is preferable that the gate electrode 24 come into ohmic contact with the cap layer 17.

The passivation film 32 is provided on the barrier layer 16 between the source electrode 18 and the gate electrode 24 and between the drain electrode 20 and the gate electrode 24. The passivation film 32 has a function of protecting the surface of the barrier layer 16.

The passivation film 32 includes a first insulating film 32a that is provided so as to come into contact with the surface of the barrier layer 16 and a second insulating film 32b that is provided on the first insulating film 32a. The passivation film 32 has a laminated structure of the first insulating film 32a and the second insulating film 32b.

The first insulating film 32a includes nitrogen. The thickness of the first insulating film 32a is equal to or greater than 0.2 nm and less than 2 nm. It is preferable that the thickness of the first insulating film 32a be equal to or greater than 0.5 nm and equal to or less than 1 nm.

The first insulating film 32a is, for example, a silicon nitride (SiNx) film, an aluminum nitride (AlNx) film, a silicon oxynitride (SiOyNx) film, or an aluminum oxynitride (AlOyNx) film.

The second insulating film 32b includes oxygen. The nitrogen concentration of the second insulating film 32b is lower than that of the first insulating film 32a. It is preferable that the thickness of the second insulating film 32b be greater than the thickness of the first insulating film 32a. For example, the thickness of the second insulating film 32b is equal to or greater than 10 nm and equal to or less than 200 nm. The second insulating film 32b is, for example, a silicon oxide (SiOx) film or an aluminum oxide (AlOx) film.

Elements included in the first insulating film 32a or the second insulating film 32b can be analyzed by, for example, high-resolution Rutherford back-scattering (RBS) spectrometry or secondary ion mass spectrometry (SIMS). In addition, the thickness of the first insulating film 32a or the second insulating film 32b can be measured by, for example, a high-resolution transmission electron microscope (TEM).

Next, an example of a method for manufacturing the semiconductor device according to this embodiment will be described. FIGS. 2 to 6 are cross-sectional views schematically illustrating the semiconductor device which is being manufactured in the method for manufacturing the semiconductor device according to this embodiment.

In the method for manufacturing the semiconductor device according to the embodiment, the passivation film including the first insulating film and the second insulating film is formed. The first insulating film includes nitrogen, has a thickness equal to or greater than 0.2 nm and equal to or less than 2 nm, and is formed on the surface of the second GaN-based semiconductor layer which is provided on the first GaN-based semiconductor layer and has a wider band gap than the first GaN-based semiconductor layer. The second insulating film includes oxygen and is formed on the first insulating film.

First, for example, a Si substrate is prepared as the substrate 10. Then, the buffer layer 12 is grown on the Si substrate by, for example, epitaxial growth.

Figure 2:
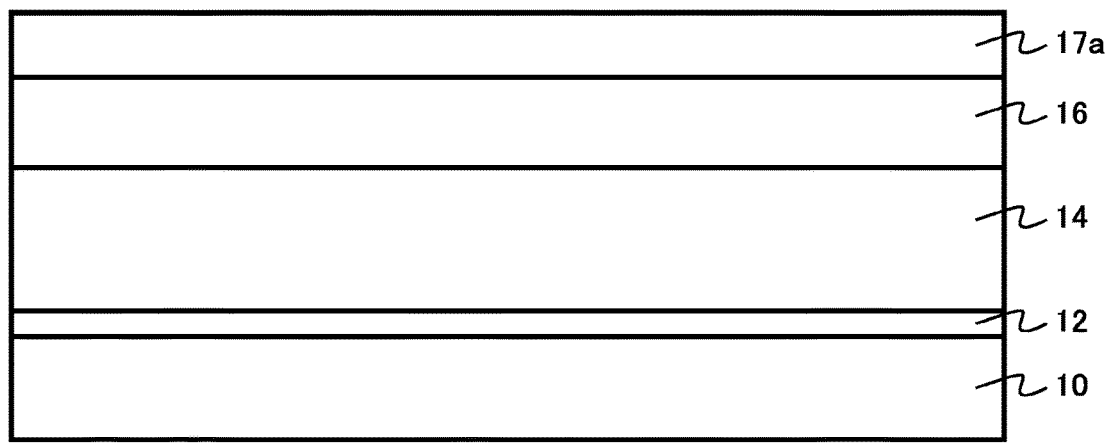
FIG. 2 is a cross-sectional view schematically illustrating the semiconductor device which is being manufactured in a method for manufacturing the semiconductor device according to the first embodiment.

Then, an undoped GaN which will be the channel layer (first GaN-based semiconductor layer) 14, an undoped $Al_{0.25}Ga_{0.75}N$ which will be the barrier layer (second GaN-based semiconductor layer) 16, and a p-type GaN layer 17a which will be the cap layer 17 are formed on the buffer layer 12 by epitaxial growth (FIG. 2).

Figure 3:
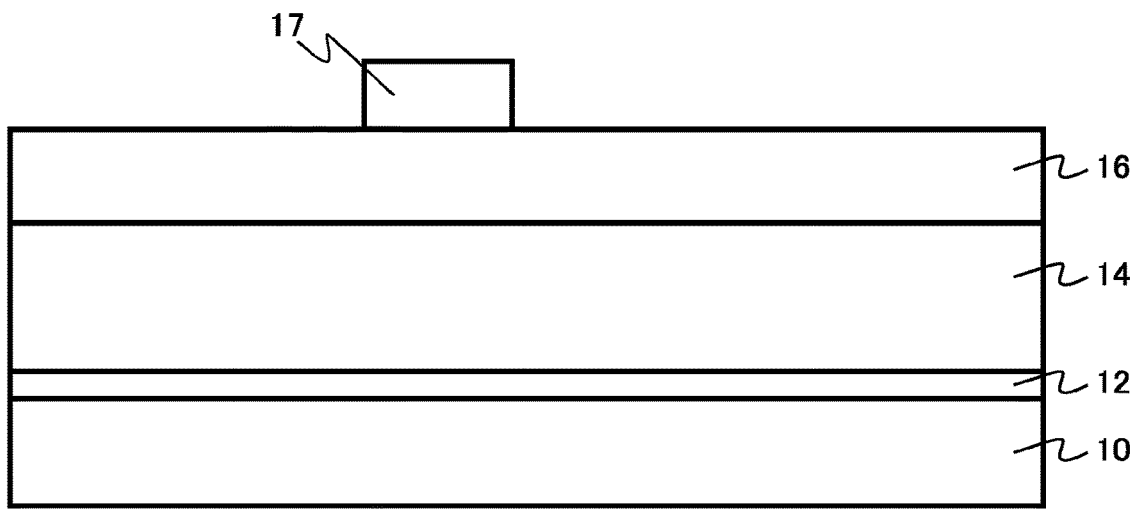
FIG. 3 is a cross-sectional view schematically illustrating the semiconductor device which is being manufactured in the method for manufacturing the semiconductor device according to the first embodiment.

Then, a portion of the p-type GaN layer 17a is removed to form the cap layer 17 (FIG. 3). For example, the cap layer 17 is formed by etching a portion of the p-type GaN layer 17a using a reactive ion etching (RIE) method.

Figure 4:
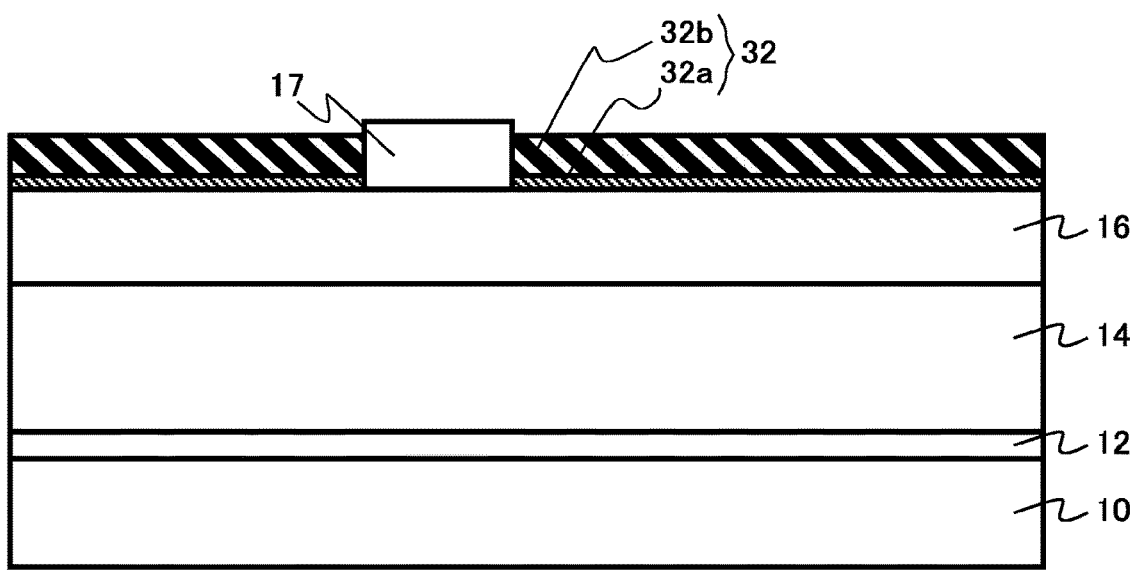
FIG. 4 is a cross-sectional view schematically illustrating the semiconductor device which is being manufactured in the method for manufacturing the semiconductor device according to the first embodiment.

Then, the passivation film 32 including the first insulating film 32a and the second insulating film 32b is formed on the surface of the barrier layer 16 which is exposed by etching (FIG. 4). The passivation film 32 is formed by, for example, an atomic layer deposition (ALD) method.

When the passivation film 32 is formed, first, the first insulating film 32a which includes nitrogen and has a thickness that is equal to or greater than 0.2 nm and less than 2 nm is formed on the barrier layer 16. Then, the second insulating film 32b including oxygen is formed on the first insulating film 32a. It is preferable that the first insulating film 32a and the second insulating film 32b be continuously formed in the same ALD equipment.

For example, first, a first precursor including Si (silicon) is supplied to the surface of the barrier layer 16 and the barrier layer 16 having the first precursor supplied thereto is exposed to plasma including nitrogen to form the first insulating film 32a. For example, the first precursor is tris(dimethyl-amino)silane ($HSi(N(CH_3)_2)_3$) and the plasma including nitrogen is nitrogen ($N_2$) plasma. In this case, the first insulating film 32a is a silicon nitride (SiNx) film.

A single-layer silicon nitride film is formed by the above-mentioned process. For example, the supply of the first precursor and processing in the plasma including nitrogen may be repeatedly performed to form a multi-layer silicon nitride film, thereby increasing the thickness of the first insulating film 32a. For example, a second precursor including aluminum (Al) may be supplied to the surface of the barrier layer 16 to form the first insulating film 32a as an aluminum nitride (AlNx) film.

Then, for example, the second precursor including silicon (Si) is supplied to the surface of the first insulating film 32a and the first insulating film 32a having the second precursor supplied thereto is exposed to plasma including oxygen to form the second insulating film 32b. For example, the second precursor is tris(dimethyl-amino)silane ($HSi(N(CH_3)_2)_3$) and the plasma including oxygen is oxygen ($O_2$) plasma. In this case, the second insulating film 32b is a silicon oxide (SiOx) film.

A single-layer silicon oxide film is formed by the above-mentioned process. For example, the supply of the second precursor and processing in the plasma including oxygen may be repeatedly performed to form a multi-layer silicon oxide film, thereby increasing the thickness of the second insulating film 32b. In addition, for example, the second precursor including aluminum (Al) may be supplied to the surface of the first insulating film 32a to form the second insulating film 32b as an aluminum oxide (AlOx) film.

The passivation film 32 may be formed as follows: the first insulating film 32a and a portion of the second insulating film 32b are formed by the atomic layer deposition (ALD) method; and the remainder of the second insulating film 32b is formed by a method different from the atomic layer deposition method. For example, after a portion of the second insulating film 32b is formed by the atomic layer deposition (ALD) method, the second insulating film 32b is grown by an LPCVD method such that the thickness thereof increases.

Then, the titanium nitride (TiN) gate electrode 24 is formed on the p-type cap layer 17 by a liftoff method (FIG. 5).

Then, a portion of the passivation film 32 is removed to expose the surface of the barrier layer 16. The source electrode 18 and the drain electrode 20 having a stacked structure of, for example, titanium (Ti) and aluminum (Al) are formed on the exposed surface of the barrier layer 16 by the liftoff method (FIG. 6).

The semiconductor device 100 illustrated in FIG. 1 is manufactured by the above-mentioned manufacturing method.

Next, the function and effect of the semiconductor device 100 according to this embodiment will be described. FIG. 7 is a diagram illustrating the function and effect of the semiconductor device 100 according to this embodiment.

In the HEMT using the GaN-based semiconductor, it is preferable to apply an insulating film with a low charge trap energy level as the passivation film in order to reduce, for example, current collapse. An example of the insulating film with a low charge trap energy level is an insulating film including oxygen, such as a silicon oxide film.

However, when the insulating film including oxygen, such as a silicon oxide film, is formed as the passivation film on the GaN-based semiconductor layer, such as an AlGaN layer, the current collapse does not necessarily disappear. It is considered that this is because the interface between the GaN-based semiconductor layer and the passivation film is uneven due to the oxidation of the surface of the GaN-based semiconductor layer, such as an AlGaN layer, which makes it difficult to form a homogeneous interface. That is, it is considered that the charge trap energy level is formed at the heterogeneous interface.

In the semiconductor device 100 according to this embodiment, the first insulating film 32a including nitrogen is provided as an intermediate layer between the second insulating film 32b including oxygen and the barrier layer 16 which is an AlGaN layer. Therefore, the formation of an oxide on the surface of the AlGaN layer is suppressed. As a result, the trapping of charge to the interface is suppressed and the current collapse of the HEMT is suppressed.

FIG. 7 illustrates the evaluation results of the gate insulating film by X-ray photoelectron spectroscopy (XPS) in the embodiment and a comparative example. In the embodiment, the passivation film has a stacked structure of a silicon nitride film and a silicon oxide film and is formed by the ALD method. In the comparative example, the passivation film is a single-layer silicon oxide film and is formed by the ALD method. The passivation film is formed on the GaN layer.

As can be seen from FIG. 7, the strength of the binding energy of gallium and oxygen represented by an arrow in FIG. 7 is reduced in the embodiment. Therefore, in the structure of the passivation film according to the embodiment, the formation of a gallium oxide (GaOx) on the surface of the GaN layer is suppressed. It is considered that the formation of an oxide on the surface of other GaN-based semiconductor layers, such as an AlGaN layer, is similarly suppressed by the structure of the passivation film according to the embodiment.

When the thickness of the silicon nitride film is large, there is a concern that the current collapse will increase. This is because the trapping of charge to the silicon nitride film appears as characteristics.

Therefore, the thickness of the first insulating film 32a is preferably less than 2 nm and more preferably equal to or less than 1 nm in order to suppress the current collapse.

When the first insulating film 32a is too thin, there is a concern that an oxide will be formed on the surface of the AlGaN layer while the semiconductor device is being manufactured or while a product is operating. The thickness of the first insulating film 32a is preferably equal to or greater than 0.2 nm and more preferably equal to or greater than 0.5 nm in order to suppress the formation of an oxide.

As described above, according to this embodiment, it is possible to provide a semiconductor device in which the formation of an oxide at the interface between the GaN-based semiconductor layer and the passivation film is suppressed and current collapse is suppressed and a method for manufacturing the semiconductor device.

Second Embodiment

A semiconductor device according to this embodiment includes a first GaN-based semiconductor layer, a second GaN-based semiconductor layer provided on the first GaN-based semiconductor layer and having a wider band gap than the first GaN-based semiconductor layer, a source electrode electrically connected to the second GaN-based semiconductor layer, a drain electrode electrically connected to the second GaN-based semiconductor layer, a gate electrode provided between the source electrode and the drain electrode, and a gate insulating film including a first insulating film that includes nitrogen on the second GaN-based semiconductor layer, is provided between the second GaN-based semiconductor layer and the gate electrode, and has a thickness equal to or greater than 0.2 nm and less than 2 nm and a second insulating film that includes oxygen and is provided between the first insulating film and the gate electrode.

FIG. 8 is a cross-sectional view schematically illustrating the semiconductor device according to this embodiment. The semiconductor device according to the embodiment is a HEMT using a GaN-based semiconductor. The HEMT according to this embodiment includes a gate insulating film and has a so-called metal insulator semiconductor (MIS) gate structure.

As shown in FIG. 8, a semiconductor device (HEMT) 200 includes a substrate 10, a buffer layer 12, a channel layer (first GaN-based semiconductor layer) 14, a barrier layer (second GaN-based semiconductor layer) 16, a source electrode 18, a drain electrode 20, a gate insulating film 22, and a gate electrode 24.

The substrate 10 is made of, for example, silicon (Si). For example, sapphire ($Al_2O_3$) or silicon carbide (SiC) can be applied, in addition to silicon.

The buffer layer 12 is provided on the substrate 10. The buffer layer 12 has a function of reducing the lattice mismatch between the substrate 10 and the channel layer 14. The buffer layer 12 has, for example, a multi-layer structure of aluminum gallium nitride ($Al_WGa_{1-W}N$ (0<W<1)).

The channel layer 14 is provided on the buffer layer 12. The channel layer 14 is made of, for example, undoped $Al_XGa_{1-X}N$ (0≤X<1). Specifically, for example, the channel layer 14 is made of undoped GaN. The thickness of the channel layer 14 is, for example, equal to or greater than 0.5 μm and equal to or less than 3 μm.

The barrier layer 16 is provided on the channel layer 14. The band gap of the barrier layer 16 is wider than the band gap of the channel layer 14. The barrier layer 16 is made of, for example, undoped $Al_YGa_{1-Y}N$ (0<Y≤1, X<Y). More specifically, the barrier layer 16 is made of, for example, undoped $Al_{0.25}Ga_{0.75}N$. For example, the thickness of the barrier layer 16 is equal to or greater than 15 nm and equal to or less than 50 nm.

A heterojunction interface is provided between the channel layer 14 and the barrier layer 16. When the semiconductor device 100 is turned on, a two-dimensional electron gas (2DEG) is formed at the heterojunction interface and functions as a carrier.

The source electrode 18 and the drain electrode 20 are formed on the barrier layer 16. The source electrode 18 and the drain electrode 20 are, for example, metal electrodes. The metal electrode has, for example, a stacked structure of titanium (Ti) and aluminum (Al). It is preferable that the source electrode 18 and the drain electrode 20 come into ohmic contact with the barrier layer 16. The distance between the source electrode 18 and the drain electrode 20 is, for example, equal to or greater than 5 μm and equal to or less than 30 μm.

The gate insulating film 22 is formed on the barrier layer 16 between the source electrode 18 and the drain electrode 20. The gate electrode 24 is provided on the gate insulating film 22. The gate insulating film 22 comes into direct contact with the barrier layer.

Since the semiconductor device 200 according to this embodiment includes the gate insulating film 22, it is possible to suppress a gate leakage current.

The gate insulating film 22 includes a first insulating film 22a that is provided between the barrier layer 16 and the gate electrode 24 and a second insulating film 22b that is provided between the first insulating film 22a and the gate electrode 24. The gate insulating film 22 has a stacked structure of the first insulating film 22a and the second insulating film 22b.

The first insulating film 22a includes nitrogen. The thickness of the first insulating film 22a is equal to or greater than 0.2 nm and less than 2 nm. It is preferable that the thickness of the first insulating film 22a be equal to or greater than 0.5 nm and equal to or less than 1 nm.

The first insulating film 22a is, for example, a silicon nitride (SiNx) film, an aluminum nitride (AlNx) film, a silicon oxynitride (SiOyNx) film, or an aluminum oxynitride (AlOyNx) film.

The second insulating film 22b includes oxygen. The nitrogen concentration of the second insulating film 22b is lower than that of the first insulating film 22a. It is preferable that the thickness of the second insulating film 22b be greater than the thickness of the first insulating film 22a. For example, the thickness of the second insulating film 22b is equal to or greater than 10 nm and equal to or less than 50 nm. The second insulating film 22b is, for example, a silicon oxide (SiOx) film or an aluminum oxide (AlOx) film.

Elements included in the first insulating film 22a or the second insulating film 22b can be analyzed by, for example, high-resolution Rutherford back-scattering (RBS) spectrometry. In addition, the thickness of the first insulating film 22a or the second insulating film 22b can be measured by, for example, a high-resolution transmission electron microscope (TEM).

The gate electrode 24 is made of, for example, doped polysilicon or metal. Examples of the metal include titanium nitride (TiN) and tungsten (W).

Next, an example of a method for manufacturing the semiconductor device according to the embodiment will be described. FIGS. 9 to 12 are cross-sectional views schematically illustrating the semiconductor device which is being manufactured in the method for manufacturing the semiconductor device according to this embodiment.

First, for example, a Si substrate is prepared as the substrate 10. Then, the buffer layer 12 is grown on the Si substrate by, for example, epitaxial growth.

Then, undoped GaN, which will be the channel layer (first GaN-based semiconductor layer) 14, and undoped $Al_{0.25}Ga_{0.75}N$, which will be the barrier layer (second GaN-based semiconductor layer) 16, are grown on the buffer layer 12 by epitaxial growth (FIG. 9).

Then, the gate insulating film 22 including the first insulating film 22a and the second insulating film 22b is formed on the surface of the barrier layer 16 (FIG. 10). The gate insulating film 22 is formed by, for example, the atomic layer deposition (ALD) method.

When the gate insulating film 22 is formed, first, the first insulating film 22a which includes nitrogen and has a thickness that is equal to or greater than 0.2 nm and less than 2 nm is formed on the barrier layer 16. Then, the second insulating film 22b including oxygen is formed on the first insulating film 22a. It is preferable that the first insulating film 22a and the second insulating film 22b be continuously formed in the same ALD equipment.

For example, first, a first precursor including silicon (Si) is supplied to the surface of the barrier layer 16 and the barrier layer 16 having the first precursor supplied thereto is exposed to plasma including nitrogen to form the first insulating film 22a. For example, the first precursor is tris(dimethyl-amino)silane $(HSi(N(CH_3)_2)_3$ and the plasma including nitrogen is nitrogen $(N_2)$ plasma. In this case, the first insulating film 22a is a silicon nitride (SiNx) film.

A single-layer silicon nitride film is formed by the above-mentioned process. For example, the supply of the first precursor and processing in the plasma including nitrogen may be repeatedly performed to form a multi-layer silicon nitride film, thereby increasing the thickness of the first insulating film 22a. For example, a second precursor including aluminum (Al) may be supplied to the surface of the barrier layer 16 to form the first insulating film 22a as an aluminum nitride (AlNx) film.

Then, for example, the second precursor including silicon (Si) is supplied to the surface of the first insulating film 22a and the first insulating film 22a having the second precursor supplied thereto is exposed to plasma including oxygen to form the second insulating film 22b. For example, the second precursor is tris(dimethyl-amino)silane $(HSi(N(CH_3)_2)_3$ and the plasma including oxygen is oxygen $(O_2)$ plasma. In this case, the second insulating film 22b is a silicon oxide (SiOx) film.

A single-layer silicon oxide film is formed by the above-mentioned process. For example, the supply of the second precursor and processing in the plasma including oxygen may be repeatedly performed to form a multi-layer silicon oxide film, thereby increasing the thickness of the second insulating film 22b. In addition, for example, the second precursor including aluminum (Al) may be supplied to the surface of the first insulating film 22a to form the second insulating film 22b as an aluminum oxide (AlOx) film.

The gate insulating film 22 may be formed as follows: the first insulating film 22a and a portion of the second insulating film 22b are formed by the atomic layer deposition (ALD) method; and the remainder of the second insulating film 22b is formed by a method different from the atomic layer deposition method. For example, after a portion of the second insulating film 22b is formed by the atomic layer deposition (ALD) method, the second insulating film 22b is grown by an LPCVD method such that the thickness thereof increases.

Then, for example, the titanium nitride (TiN) gate electrode 24 is formed on the gate insulating film 22 by the liftoff method (FIG. 11).

Then, a portion of the gate insulating film 22 is removed such that the surface of the barrier layer 16 is exposed. The source electrode 18 and the drain electrode 20 having a stacked structure of, for example, titanium (Ti) and aluminum (Al) are formed on the exposed surface of the barrier layer 16 by the liftoff method (FIG. 12).

The semiconductor device 200 illustrated in FIG. 8 is manufactured by the above-mentioned manufacturing method.

Next, the function and effect of the semiconductor device 200 according to this embodiment will be described.

In the HEMT which uses the GaN-based semiconductor and includes the gate insulating film, it is preferable to apply an insulating film with a wide band gap in order to suppress the leakage current of the gate insulating film. An example of the insulating film with a wide band gap is an insulating film including oxygen, such as a silicon oxide film.

However, when the gate insulating film including oxygen, such as a silicon oxide film, is formed on the GaN-based semiconductor layer, such as an AlGaN layer, in some cases, a variation in the threshold voltage of the HEMT occurs. It is considered that this is because the interface between the GaN-based semiconductor layer and the gate insulating film is uneven due to the oxidation of the surface of the GaN-based semiconductor layer, such as an AlGaN layer, which makes it difficult to form a homogeneous interface. That is, it is considered that a charge trap energy level is formed at the heterogeneous interface.

In the semiconductor device 200 according to this embodiment, the first insulating film 22a including nitrogen is provided as an intermediate layer between the second insulating film 22b including oxygen and the barrier layer 16 which is an AlGaN layer. Therefore, the formation of an oxide on the surface of the AlGaN layer is suppressed. As a result, the trapping of charge is suppressed and a variation in the threshold voltage of the HEMT is suppressed.

The function of suppressing the formation of an oxide on the surface of the AlGaN layer is the same as that described with reference to FIG. 7 in the first embodiment.

When the thickness of the silicon nitride film is large, there is a concern that the hysteresis of a MIS gate structure will increases. This is because the trapping and detrapping of charge to and from the silicon nitride film appear as characteristics.

Therefore, the thickness of the first insulating film 22a is preferably less than 2 nm and more preferably equal to or less than 1 nm, in order to suppress the hysteresis of the gate insulating film 22.

When the first insulating film 22a is too thin, there is a concern that an oxide will be formed on the surface of the AlGaN layer while the semiconductor device is being manufactured or while a product is operating. The thickness of the first insulating film 22a is preferably equal to or greater than 0.2 nm and more preferably equal to or greater than 0.5 nm in order to suppress the formation of an oxide.

As described above, according to this embodiment, it is possible to provide a semiconductor device in which the formation of an oxide on the surface of the AlGaN layer is suppressed and a variation in the threshold voltage is suppressed and a method for manufacturing the semiconductor device.

In the embodiment, AlGaN is given as an example of the material forming the barrier layer. However, for example, InGaN, InAlN, and InAlGaN including indium (In) may be applied. In addition, AlN may be applied as the material forming the barrier layer.

In the embodiment, undoped AlGaN is given as an example of the material forming the barrier layer. However, n-type AlGaN may be applied.

In the embodiment, the p-type GaN is described as an example of the cap layer. However, for example, p-type AlGaN may be applied.

In the embodiment, the passivation film or the gate insulating film is formed by the ALD method. In particular, it is preferable to use the ALD method in order to form a high-quality thin film as the first insulating film. However, for example, other forming methods, such as an ECR sputtering method, may be applied.

While certain embodiments have been described, these embodiments have been presented by way of example only, and are not intended to limit the scope of the inventions. Indeed, a semiconductor device and a method for manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first GaN-based semiconductor layer;
a second GaN-based semiconductor layer provided on the first GaN-based semiconductor layer and having a wider band gap than the first GaN-based semiconductor layer;
a source electrode electrically connected to the second GaN-based semiconductor layer;
a drain electrode electrically connected to the second GaN-based semiconductor layer;
a gate electrode provided between the source electrode and the drain electrode;
a third p-type GaN-based semiconductor layer provided between the second GaN-based semiconductor layer and the gate electrode; and
a passivation film provided on the second GaN-based semiconductor layer between the source electrode and the gate electrode and between the gate electrode and the drain electrode, the passivation film including a first insulating film and a second insulating film, the first insulating film including nitrogen, the first insulating film having a thickness equal to or greater than 0.2 nm and less than 2 nm, the second insulating film including oxygen, the second insulating film provided on the first insulating film, the first and the second insulating film being in direct contact with a side surface of the third GaN-based semiconductor layer, the second insulating film having a thickness equal to or greater than 10 nm and equal to or less than 200 nm, the first and second insulating films not being in direct contact with the side surface of the gate electrode.

2. The device according to claim 1, wherein nitrogen concentration of the second insulating film is lower than nitrogen concentration of the first insulating film.

3. The device according to claim 1, wherein the second insulating film is a silicon oxide film or an aluminum oxide film.

4. The device according to claim 1, wherein the passivation film is formed by an atomic layer deposition (ALD) method.

5. The device according to claim 1, wherein the first insulating film and a portion of the second insulating film are formed by an atomic layer deposition (ALD) method and the remainder of the second insulating film is formed by a method different from the atomic layer deposition method.

* * * * *